(12) United States Patent
Palikaras et al.

(10) Patent No.: US 9,890,925 B2
(45) Date of Patent: Feb. 13, 2018

(54) OPTICAL DEVICE

(71) Applicants: George Palikaras, London (GB); Themos Kallos, London (GB)

(72) Inventors: George Palikaras, London (GB); Themos Kallos, London (GB)

(73) Assignee: LAMDA GUARD TECHNOLOGIES LTD, London (GB)

( * ) Notice: Subject to any disclaimer, the term of this patent is extended or adjusted under 35 U.S.C. 154(b) by 686 days.

(21) Appl. No.: 14/385,017

(22) PCT Filed: Mar. 7, 2013

(86) PCT No.: PCT/GB2013/000098
§ 371 (c)(1),
(2) Date: Sep. 12, 2014

(87) PCT Pub. No.: WO2013/136035
PCT Pub. Date: Sep. 19, 2013

(65) Prior Publication Data
US 2015/0036350 A1    Feb. 5, 2015

(30) Foreign Application Priority Data

Mar. 14, 2012   (GB) .................................. 1204517.5

(51) Int. Cl.
*H01S 3/00*   (2006.01)
*F21V 7/00*   (2006.01)
(Continued)

(52) U.S. Cl.
CPC ............ *F21V 7/0025* (2013.01); *G02B 1/002* (2013.01); *G02B 1/007* (2013.01); *H01L 33/60* (2013.01); *H01L 2933/0083* (2013.01)

(58) Field of Classification Search
CPC ....... G02B 1/007; G02B 1/002; F21V 7/0025; H01L 33/60; H01L 2933/0083
(Continued)

(56) References Cited

U.S. PATENT DOCUMENTS 7,352,941 B2 *   4/2008   Bratkovski ............ B82Y 20/00
                                                356/480
8,134,774 B2 *   3/2012   Wang .................... B82Y 20/00
                                                359/333
(Continued)

FOREIGN PATENT DOCUMENTS

CN     102074646     5/2011
CN     102346268     2/2012
(Continued)

OTHER PUBLICATIONS

Harries, M.D., et al., "LED Emission Through Sub-Wavelength Apertures," *Technical Digest CD-ROM/Conference on Lasers and Electro-Optics, Quantum Electronics and Laser Science Conference, Conference on Photonic Applications, Systems and Technologies: Long Beach Convention Center*, Long Beach, California, USA, pp. 1-2 (May 2006).
(Continued)

*Primary Examiner* — Mark Hellner
(74) *Attorney, Agent, or Firm* — Hamilton, Brook, Smith & Reynolds, P.C.

(57) ABSTRACT

There is provided a device arranged to couple with an electromagnetic source. The device comprises an optical metamaterial arranged to increase the intensity of radiation at a predetermined optical wavelength. The optical metamaterial has a periodic reflective component having a dimension no greater than the predetermined wavelength.

41 Claims, 12 Drawing Sheets

(51) Int. Cl.
*G02B 1/00* (2006.01)
*H01L 33/60* (2010.01)

(58) Field of Classification Search
USPC .......................................................... 359/333
See application file for complete search history.

(56) References Cited

U.S. PATENT DOCUMENTS

| | | |
|---|---|---|
| 2006/0245464 A1 | 11/2006 | Hori et al. |
| 2007/0252980 A1 | 11/2007 | Wang et al. |
| 2008/0231184 A1 | 9/2008 | Lee et al. |
| 2009/0225805 A1 | 9/2009 | Nagatomo |
| 2010/0062554 A1 | 3/2010 | Kim |
| 2010/0091225 A1 | 4/2010 | Cho et al. |

FOREIGN PATENT DOCUMENTS

| | | |
|---|---|---|
| EP | 0992833 A2 | 4/2000 |
| JP | 2006-128008 | 10/2004 |
| JP | 2011-108748 | 6/2011 |
| KR | 2012 0029269 | 3/2012 |
| WO | WO 2006/098899 | 3/2007 |

OTHER PUBLICATIONS

Pendry, J.B., "Negative Refraction Makes a Perfect Lens," *Physical Review Letters*, 85(18):3966-3969 (Oct. 2000).
Notification of Transmittal of the International Search Report and the Written Opinion of the International Searching Authority, or the Declaration for PCT/GB2013/000098, dated Jul. 22, 2014.
UK Intellectual Property Office Search Report for GB 1204517.5, dated Jul. 3, 2012.

\* cited by examiner

OPTICAL DEVICE

RELATED APPLICATIONS

This application is the U.S. National Stage of International Application No. PCT/GB2013/000098, filed on Mar. 7, 2013, published in English, which claims priority under 35 U.S.C. § 119 or 365 to Great Britain, Application No. 1204517.5, filed Mar. 14, 2012.

FIELD

The present disclosure relates to a device for enhancing the output of an electromagnetic source. In particular, the present disclosure relates to a device for increasing the intensity of radiation at a predetermined wavelength from a source. More particularly, the present disclosure relates to a device for increasing the efficacy of a light source.

BACKGROUND

There are three main types of light sources widely used today at a domestic/consumer level: incandescents, compact-fluorescents (CFLs), and Light Emitting Diodes (LEDs).

The light efficiency of different lights sources may be measured in terms of their luminous efficacy, which has units of lumens per Watt (lm/W). This is the amount of lumens emitted by a light source for a given wall-plug electrical power fed into the device. A candle has a luminous efficacy of 0.3 lm/W (which is on the low end of the scale) while an ideal monochromatic green laser has a luminous efficacy around 683 lm/W. Such lasers are the most efficient light sources and occupy the high end of the efficacy scale. The amount of luminous power required by a light source to adequately light a small room is around 1000 lumens. The objective of an efficient light source is to reach this amount of luminous power while consuming the smallest possible electrical power.

Incandescent bulbs were the first bulbs ever invented and convert electricity to light. Their main technology relies upon heating a metal filament (usually tungsten) at very high temperatures, until it glows. The technology was first developed over 200 years ago and was commercialized in the late 19th century. It provides a type of light (spectrum) very pleasant to the human eye because it is similar to the spectrum of light emitted by the sun, for which our eyes are mostly accustomed to. This is the spectrum of a black body radiator.

However, incandescent bulbs are very inefficient light sources as their power consumption is extremely high for the light output they produce. For example, 60 W incandescent bulbs have a luminous efficacy around 15 lm/W, thus emitting around 900 lumens of light. The efficacy of incandescent bulbs is so low due to the heating process that takes place. Most of the input electrical power (around 90%) is released as heat at infrared frequencies, rather than as useful visible light.

Compact Fluorescent Lamps were designed to replace incandescent bulbs and operate based on the phenomenon of luminescence, which is the conversion of ultraviolet (UV) light into visible light. The CFLs typically contain inert gases, such as mercury and argon. When electricity is supplied at the end of the tube containing the gases, it forces the mercury atoms in the gas compound to emit energy at UV wavelengths. This UV light is absorbed by the special chemical coating of the tube and is re-emitted via luminescence as visible light. The chemical coating consists of one or more types of phosphors, each responsible for emitting light in a different range of wavelengths.

This method does not involve heating, and thus the luminous efficacy for CFLs is around 70 lm/W, being over 4 times more efficient than incandescents. At the same time, their lifespan is 10 times more compared to incandescents. However, the light quality of CFLs is nowhere near that of the light emitted by incandescents. This is because the spectrum of light emitted by CFLs is totally different compared to the more natural light produced by incandescents.

The latest type of light bulbs available is LEDs. These are solid-state devices that emit light when a small direct current (DC) voltage is applied across their terminals. The technology has been available for several decades, and low power LED lights have been routinely used in certain markets such as electronics where bright white light is not always required. In the past decade, LEDs have made a push towards consumer lighting products which are likely to become the most established lighting technology in the near future. This is because the luminous efficacy of LEDs can reach a theoretical maximum of 300 lm/W, which is 20 times higher compared to incandescents and over five times higher compared to CFLs. At the same time, LEDs have a lifespan that can reach 30 years, and so buying a good LED lamp is a safe long-term investment from a consumer's point of view.

Consumer LED lamps available today have been limited to low wattages, typically to "40-Watt equivalent". This means that such an LED lamp will emit the same light (luminosity) as a 40 W incandescent bulb, even though it will only consume about 5-10 W of electrical power. The typical luminous efficacy of current practical LED lamps is around 70-100 lm/W, comparable to that of CFLs. All LEDs are directional, which is why manufacturers have to add reflectors and various light-diffusing coatings or resin housings to make the light scatter for use in home and other lighting applications.

Each of these types of light sources has its drawbacks. Incandescents have very low efficacy and consume disproportionate large amounts of power compared to their light output. CFLs have improved efficacy, however by sacrificing the light quality, causing discomfort after prolonged exposure. LEDs have excellent efficacy, however their absolute luminous power is lower compared to that of other types of light sources.

The present disclosure relates to addressing some of the current limitations of conventional light sources.

SUMMARY

Aspects of the present disclosure are defined in the appended independent claims.

There is provided a device arranged to couple with an electromagnetic source, such as a incandescent lamp or light-emitting diode (LED). The device comprises at least one optical metamaterial comprising a periodic reflective component such as regular array of reflective elements or a regular grid. The period reflective component has a sub-wavelength dimension.

In particular, there is provided a device which can couple, receive or engage with known electromagnetic sources to enhance output such as increase efficiency or efficacy. In an optional further advancement, the device may be arranged to form a cavity. Advantageously, the device may be tuned to resonate at a particular wavelength or band of wavelengths. Further advantageously, the device is passive thereby increasing energy efficiency.

BRIEF DESCRIPTION OF THE DRAWINGS

Embodiments of the present disclosure will now be described with reference to the accompanying drawings in which.

In the figures, like reference numerals refer to like parts.

DETAILED DESCRIPTION OF THE DRAWINGS

Figure 1A:
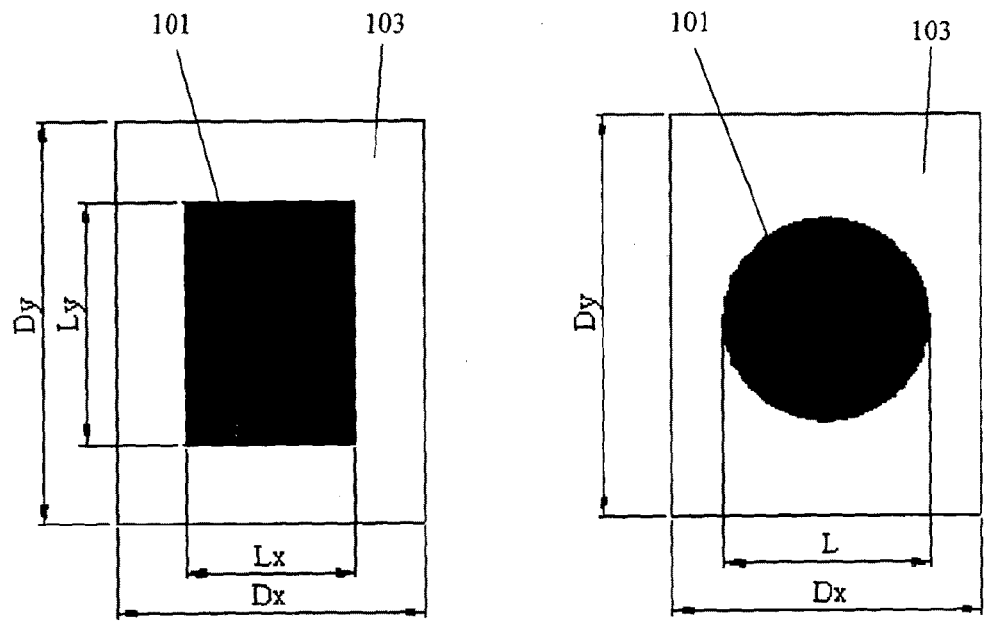
FIG. 1 shows some example unit cells for the periodic reflective component including a rectangle with sides Lx by Ly, or a circular disk with diameter L.

Metamaterials are artificially created materials that can achieve electromagnetic properties that do not occur naturally, such as negative index of refraction or electromagnetic cloaking. While the theoretical properties of metamaterials were first described in the 1960s, in the past 10-15 years there have been significant developments in the design, engineering and fabrication of such materials. A metamaterial typically consists of a multitude of unit cells, i.e. multiple individual elements, that each have a size much smaller than the wavelength of operation. These unit cells are microscopically built from conventional materials such as metals and dielectrics. However, their exact shape, geometry, size, orientation and arrangement can macroscopically affect light in an unconventional manner, such as creating resonances or unusual values for the macroscopic permittivity and permeability.

Some examples of available metamaterials are negative index metamaterials, chiral metamaterials, plasmonic metamaterials, photonic metamaterials, etc. Due to their sub wavelength nature, metamaterials that operate at microwave frequencies have a typical unit cell size of a few millimeters, while metamaterials operating at the visible part of the spectrum have a typical unit cell size of a few nanometers. Metamaterials can strongly absorb light at certain narrow range of frequencies.

For conventional materials the electromagnetic parameters such as magnetic permeability and electric permittivity arise from the response of the atoms or molecules that make up the material to an electromagnetic wave being passed therethrough. In the case of Metamaterials, these electromagnetic properties are not determined at an atomic or molecular level. Instead these properties are determined by the selection and configuration of a collection of smaller objects that make up the Metamaterial. Although such a collection of objects and their structure do not "look" at an atomic level like a conventional material, a Metamaterial can nonetheless be designed so that an electromagnetic wave will pass therethrough as if it were passing through a conventional material. Furthermore, because the properties of the Metamaterial can be determined from the composition and structure of such small (nanoscale) objects, the electromagnetic properties of the Metamaterial such as permittivity and permeability can be accurately tuned on a very small scale.

Optical Metamaterial for Radiation Enhancement

There is provided an optical metamaterial, having a periodic reflective component, arranged to increase the intensity of radiation, at a predetermined wavelength, emitted from an electromagnetic source. The periodic reflective component has a dimension less than the predetermined wavelength. It may be said that the period reflective component has a "sub-wavelength" dimension.

In an embodiment, the periodic reflective component comprises a regular array of reflective elements, wherein each reflective element has a first dimension no greater than the predetermined optical wavelength.

In an embodiment, the period reflective component comprises a 2D periodic array of unit cells. These unit cells are arranged in a planar fashion and consist of a reflecting component 101, which is of rectangular or circular shape, for example (see FIG. 1a). The unit cells include not only the main shape (i.e. the rectangle or disk) but some surrounding space 103 too, which consists of a dielectric material that also serves as a support structure for the reflective elements. This is more evidently shown in FIG. 2 where a whole array is shown, which consists of $N_x$ by $N_y$ elements 201 placed at distances $D_x$ and $D_y$ with respect to each other. These geometric parameters also define the "fill factor", which is the fraction of the surface area that is covered by the array. This is equal to $f=(D_xD_y)/(L_xL_y)$ for the example shown in FIG. 2.

Figure 1B:
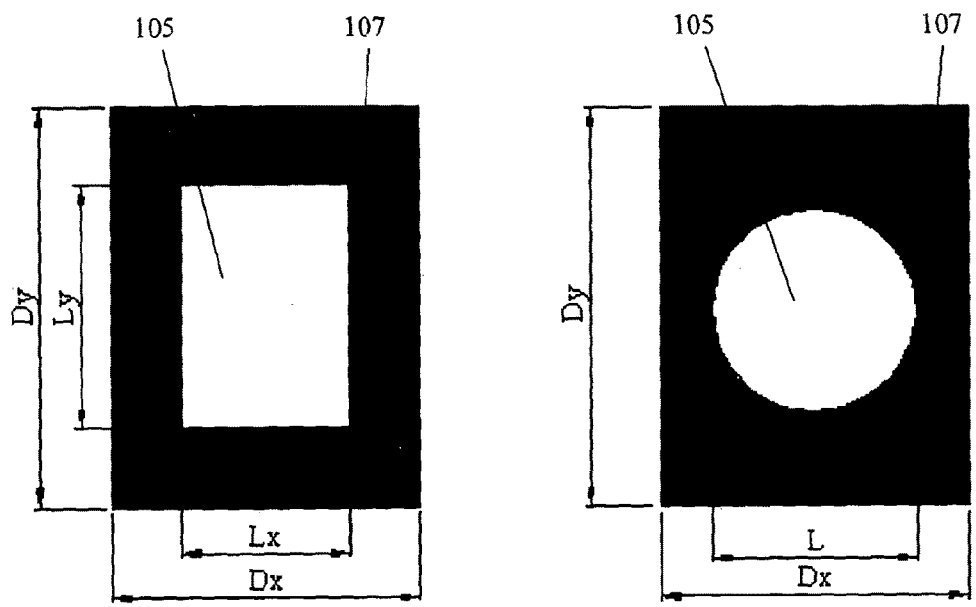

In an alternative embodiment, the periodic reflective component comprises a regular grid having a periodicity in one dimension no greater than the predetermined optical wavelength. That is, a complementary design can also be utilized, namely that the unit cell comprise a dielectric space 105 surrounded by a reflective grid 107 (see FIG. 1b). That is, the reflective component and dielectric component of the array have been interchanged.

The reflective component may be formed from any reflective material including a homogeneous materials such as metals as well as composites and nanocomposites including Bragg reflectors. The reflective component may formed, for example, from silver, gold and/or alumina, or any other metal that supports plasmonic resonances in optical frequencies.

The reflective component may be formed from a material which may itself be reflective (freestanding) but it can be understood that the material will be reflective at a specific percentage e.g. the reflectivity of a sheet of silver at a certain frequency may be 99.999%. In other words, the material behaves like a perfect reflector. The skilled person will understand that any suitable technique for producing nanoscale reflective component on a dielectric support structure may be appropriate. In embodiments, etching or lithographic techniques, such as electron beam lithography, are used. In other embodiments, a self-assembly chemical process is used. In embodiments, the reflective component may be embedded within the support structure.

Figure 2:
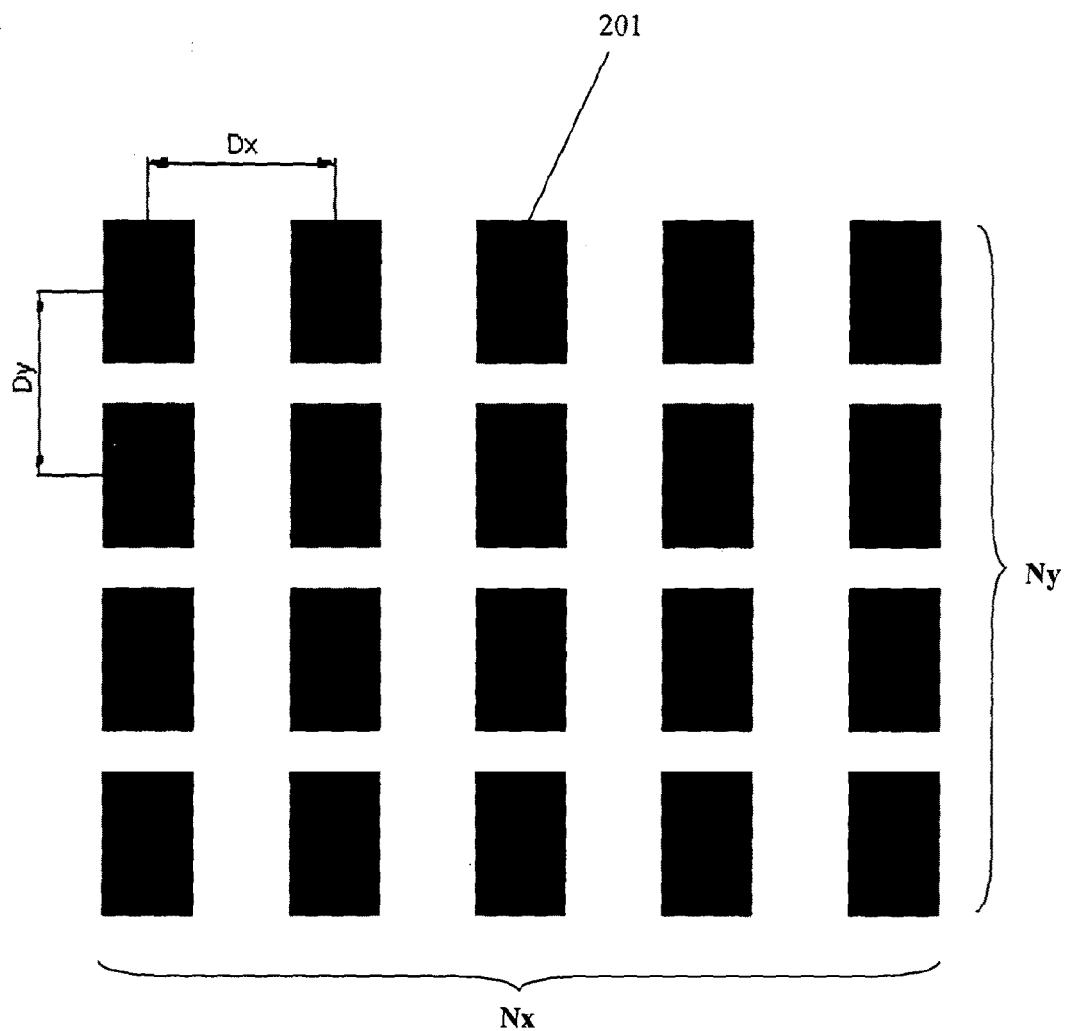
FIG. 2 illustrates an example optical metamaterial, in accordance with the present disclosure, including unit cells arranged in a periodic 2D array with spatial periods Dx and Dy in the x and y dimensions, respectively.

FIGS. 1 and 2 show rectangular elements by way of example only; any other regular shape is suitable.

In embodiments, the support structure is thermoplastic such as Plexiglass or Perspex. In other embodiments, the support structure is polycarbonate, a composite (such as $SiO_2$ and a thermoplastic), glass or silica. However, other thermally stable materials may be equally suitable.

At optical frequencies, metals can be very lossy and therefore, in embodiments, metallodielectric and/or dielectric materials and composites simultaneously achieving low losses and high thermal stability are preferred.

Typically, Lx and Ly in accordance with the present disclosure are 20 to 2000 nm depending on other design parameters such as the predetermined wavelength. The thickness of the reflective component is typically no less than $1/50^{th}$ of the wavelength of interest. In embodiments, the reflective component has a thickness greater than its skin depth.

It can be understood that the metamaterial has a "fill factor". That is, the fraction of the surface area of the metamaterial is reflective. For example, a metamaterial may have a fill factor of 50% if half the surface area is reflective. The overall reflectivity or transmissivity of the metamaterial is determined by the fill factor. There is therefore provided an arrangement in which the overall reflectivity of the metamaterial can be predetermined by selecting the parameters of the periodic reflective component.

Embodiments of the present disclosure relate to enhancing visible wavelengths to improve efficacy. The predetermined wavelength for amplification, or enhancement, is therefore typically no greater than 2000 nm. However, the present disclosure is equally applicable to wavelengths in the range 100 to 30000 nm.

Advantageously it is found that, when suitably placed, the optical metamaterial in accordance with embodiments increases the intensity of radiation at a predetermined wavelength. This is owing to the ability to tune the unique properties of the optical metamaterial. Notably, the inventors have recognised that optical metamaterials, configured in accordance with the present disclosure, may be used to amplify the light from source at a predetermined wavelength, and increase efficacy, for example.

The "sub-wavelength" periodic arrangement of reflective and transmissive elements allows the periodic reflective component to resonate at a resonant frequency (or wavelength). The skilled person will understand that there may be a narrow band of frequencies centred on the resonant frequency at which at least partial resonance will occur. The self-resonance frequency is dependent on the angle of incidence. In embodiments, the parameters of the periodic reflective component are chosen so that the metamaterial will resonant at the predetermined wavelength; this resonance may be termed the "self-resonance" of the metamaterial. At the resonant frequency, radiation at the resonant frequency will be at least partially "trapped" at the metamaterial and amplification may occur by constructive interference, for example. The metamaterial forms a type of waveguide in which the fields inside the "waveguide" are bound and contained.

At the resonant frequency, it is found that the overall reflectivity of the periodic reflective component may fall to 0-10% (that is, the transmissivity rises to 90-100%), unless the fill factor is 100%, of course. The device therefore amplifies and transmits radiation from the source at the resonant frequency. Accordingly, there is provided a device arranged to couple with an electromagnetic source and increase the intensity of radiation at a predetermined optical wavelength. This is achieved by providing an optical metamaterial having a periodic reflective component having a dimension no greater than the predetermined wavelength.

The inventors have found that in order for the metamaterial to self-resonate, a minimum number of unit cells is required. Advantageously, the inventors have found that the metamaterial requires a length of at least 2.5λ in one dimension (wherein the unit cells are sub-wavelength).

In embodiments, the device comprises further layers of metamaterials to provide multiband optical performance, for example. That is, in an embodiment, the device comprises at least a second optical metamaterial having a periodic reflective component arranged to increase the intensity of radiation, from the source, at a second predetermined wavelength. The two optical metamaterials may be combined by layering, for example. In embodiments, the periodicity of the reflective component of the second metamaterial is different to that of the first metamaterial. Therefore multiband performance may be achieved. In embodiments, a plurality of different optical metamaterials, having partially overlapping predetermined wavelengths, may be combined to provide a pseudo-broadband response. In embodiments, the device may include a plurality of optical metamaterials arranged to provide increased efficacy.

In embodiments, the inventors have found that the additional metamaterial layers are advantageously spaced by a mλ/2, where m is an integer. The skilled person will understand that an additional metamaterial may also be the same as the first metamaterial to provide a further increase in the intensity of the predetermined wavelength.

The device may further incorporate fluorescent materials such as phosphors that convert ultraviolet and blue light to white light, for example, either inside or outside the cavity. The phosphors may coat the non-reflective parts of the metamaterial, for example, to provide a different frequency response. The fluorescent material may also be embedded in the support material.

Cavity Including an Optical Metamaterial

Notably, the inventors have found that the intensity of the predetermined wavelength can be further increased by forming a cavity at least partially delimited by the optical metamaterial and a reflector.

There is provided a light emitting device comprising: a cavity at least partially delimited by an optical metamaterial and a reflector; an electromagnetic source within the cavity; and wherein the optical metamaterial comprises a periodic reflective component arranged to receive radiation from the electromagnetic source and increase the intensity of radiation at a predetermined optical wavelength.

Figure 3:
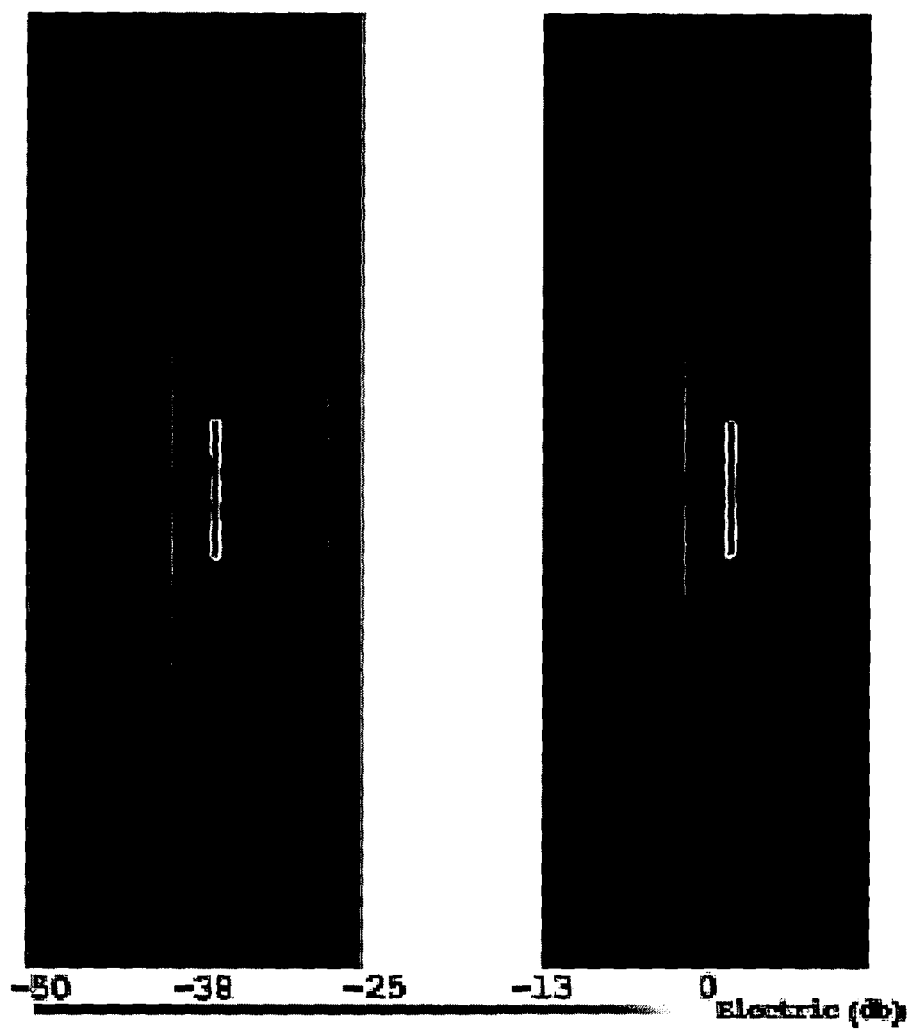
FIG. 3 shows a planar optical metamaterial surface placed next to a radiation source which sits next to a fully reflecting surface (left) and a radiation source next to the reflecting surface without the metamaterial present (right)

In an embodiment, there is provided an "open" planar cavity. The effectiveness of a planar cavity, in accordance with this embodiment, is shown in simulation in FIG. 3, where the electric field amplitude is enhanced when the optical metamaterial is placed next to a source above a reflector in a planar configuration. FIG. 3 (left) shows the source embedded between a reflector (to the left of the source) and an optical metamaterial (to the right of the source). The optical metamaterial is absent in FIG. 3 (right). The grey level shown in the figures represents the intensity of the radiation at the predetermined wavelength (white represents high intensity).

In embodiments, it is found that the optimal distance between the optical metamaterial and the reflecting surface is given by:

$$S = \left(\frac{\varphi(\theta)}{\pi} - 1\right)\frac{\lambda_0}{4} + m\frac{\lambda_0}{2},$$

where $\lambda_0$ is the wavelength in free space, m an integer and $\varphi(\theta)$ is the reflection coefficient phase of the optical metamaterial.

The reflection coefficient phase, or phase of the reflection coefficient, is a known term of art. It provides information about the phase shift caused by reflection. For any given material, it may be determined theoretically or experimentally, using a network analyser for example. The reflection coefficient phase is dependent on the angle of incidence. The reflection coefficient phase contains information about the resonance frequency of the metamaterial.

The parameter S in the above equation may be considered a "resonant distance" of the cavity. A distinction may be made between the resonance of the cavity and the self-resonance of the metamaterial.

At the value of S satisfying the above equation, resonance of the cavity is achieved and radiation is emitted from the cavity. As S increases or decreases from the resonant distance, the amount of emitted radiation greatly decreases. Accordingly, it may also be considered that there is provided a type of optical switch or filter which traps radiation unless the necessary criteria are satisfied. The bandwidth of transmission is typically a few nms.

For example, for a typical value of the reflection coefficient phase e.g. $\varphi=-150°$, and for m=1, the optimal separation distance for operation around $\lambda_0=532$ nm is 22.1 nm. In the embodiment shown in FIG. 3, $D_x=99.3$ nm, $D_y=227.0$ nm, $L_x=92.2$ nm and $L_y=216.3$ nm. The reflection coefficient phase is retrieved through measuring the S-parameters of the unit cell. The parameter m is an integer and greater values of m can also be used to adjust the distance S between the reflector and the optical metamaterial surface to a preferred value. In embodiments, m is less than 15 depending on design parameters.

This metamaterial concept gives a designer the freedom to provide controllable reflectivity by applying a special geometric pattern—for example, a 2D periodic geometry of circular elements of a certain size, spaced apart at a certain distance. This arrangement may further be achieved with a range of special patterns—for example, different element sizes, shapes, periodicity etc. This provides full control over the reflectivity of the optical metamaterial—for example, 50%, 60%, 99% reflectivity etc.

Notably, the inventors have recognised that by providing an optical metamaterial which is partially reflecting and partially transmitting, a cavity can be formed. It can be understood from the foregoing that the optical metamaterial itself may be configured to provide a predetermined self-resonant frequency and a predetermined reflectivity. The inventors have found that significant amplification may be achieved if the resonant frequency of the cavity is overlapped with the self-resonant frequency of the metamaterial. When the two resonant frequencies are overlapped and the cavity is pumped by radiation at that frequency, radiation accumulates and the radiation passes through the metamaterial. The skilled person will understand that whilst reference is made to resonant frequencies and predetermined frequencies, these frequencies may include a bandwidth. The bandwidth may be relatively narrow. In embodiments, the radiation "emitted" from the cavity has a narrow bandwidth.

It can be understood from at least the above that the angle of emission of the outgoing light beam, θ, can also be tuned between +/−60 degrees (from the vertical to the planar array axis). For any given desired angle of emission, a corresponding reflection coefficient phase may be found.

In embodiments, the reflector is a fully reflective surface such as a metal surface. In other embodiments, the reflector may be a further optical metamaterial in accordance with the present disclosure. In other embodiments, the reflector is a composite, or nanocomposite, or Bragg reflector.

In embodiments, the reflective elements of the metamaterial are placed around the source and surround it in the shape of a cavity. The light source may lie at the bottom surface of the cavity, or somewhere inside the cavity volume. The skilled person will understand from this disclosure that the precise operation of the device can be tuned by varying the reflectivity of the cavity.

Spherical or Hemi-Spherical Cavity

Figure 4:
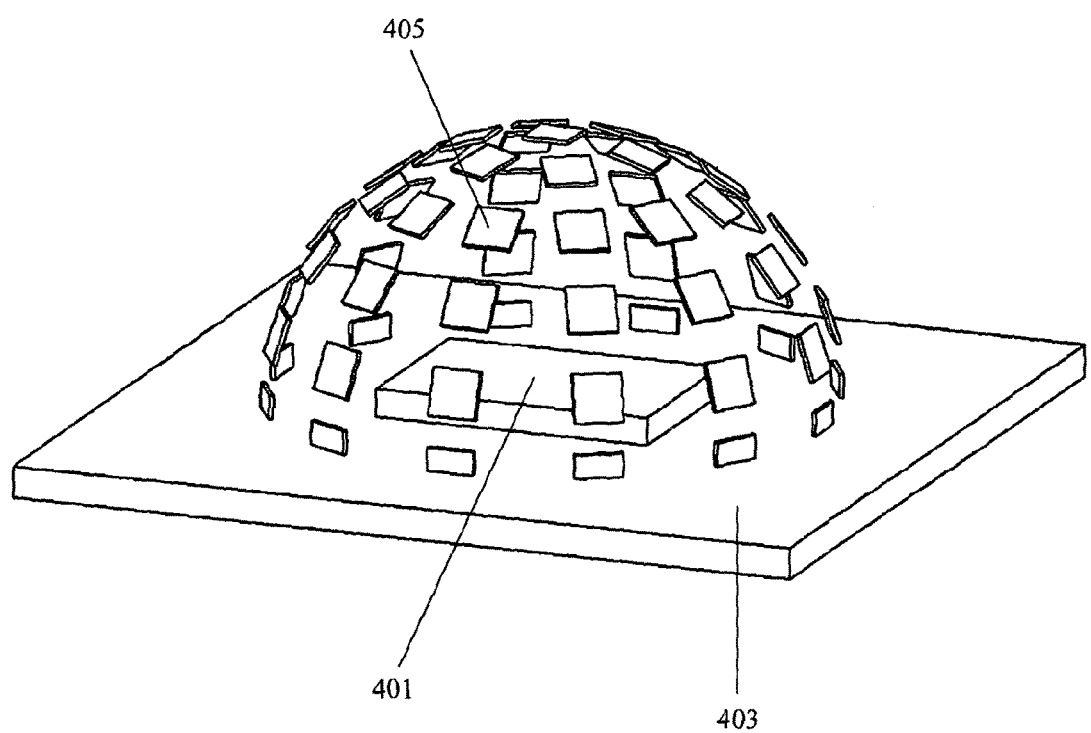
FIG. 4 is an example spherical cavity including an LED die placed on a substrate, surrounded by reflective elements in a spherical arrangement wherein the reflective elements are placed on top of a transparent support material.

In an embodiment, a spherical or hemi-spherical cavity is formed. This setup is shown in FIG. 4. A source (for example, an LED die) 401 is placed on top of a planar reflective substrate 403.

As can be understood from the foregoing, the planar substrate is optional or may not be reflective, for example. A support material in spherical shape is placed on top of the substrate and the LED die. The support material may fill the cavity. The unit cells (reflective elements) 405 are then placed on top of the support material, facing towards the sphere centre. Optionally, fluorescent material (phosphors) may be included either inside or Outside the cavity. In embodiments, the reflective surfaces of the substrate and/or the reflective component may be created using either metals or low-loss reflectors like Bragg mirrors. The skilled person will understand that the number of unit cells shown is only an indication for illustration purposes and any number of unit cells may be suitable. In embodiments, the exact number is much higher that shown in the accompanying drawings.

Cylindrical or Semi-Cylindrical Cavity

Figure 5:
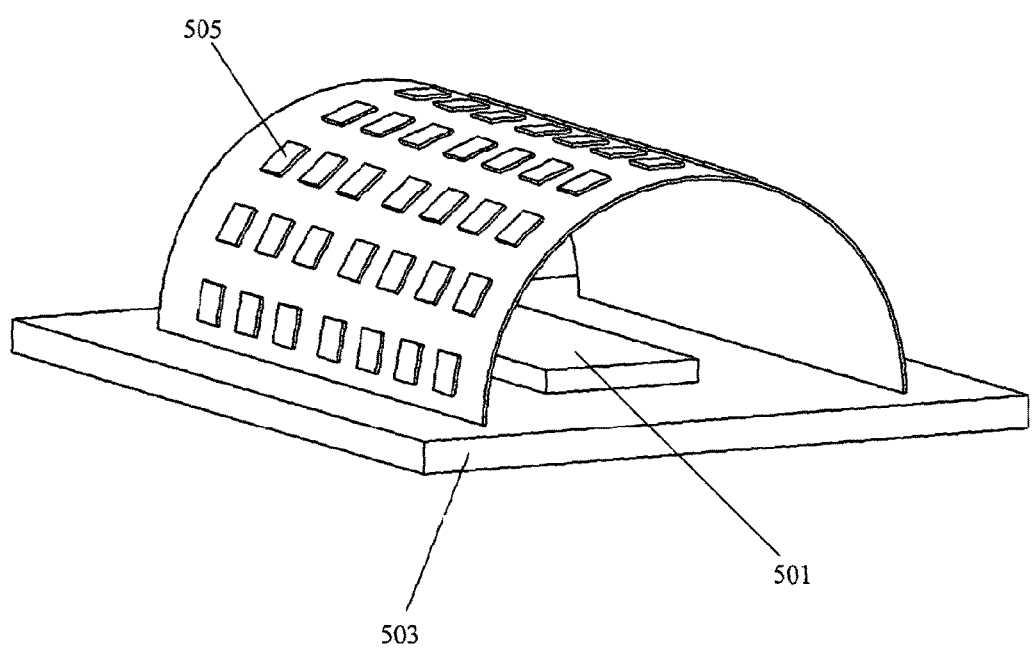
FIG. 5 shows an example cylindrical cavity including an LED die is placed on a substrate, surrounded by reflective elements in a cylindrical arrangement.

A further embodiment is shown in FIG. 5. A light source 501 (for example, an LED die) is placed on top of a planar substrate 503, which may or may not be reflective. A support material having a cylindrical shape is placed on top of the substrate and the LED die. The reflective elements 505 are placed on top of the support material, facing towards the centre. Optionally, fluorescent material (such as phosphors) may be included either inside or outside the cavity. The reflective surfaces of the substrate and/or the reflective component may be created using either metals or low-loss reflectors like Bragg mirrors.

Planar Cavity

Figure 6:
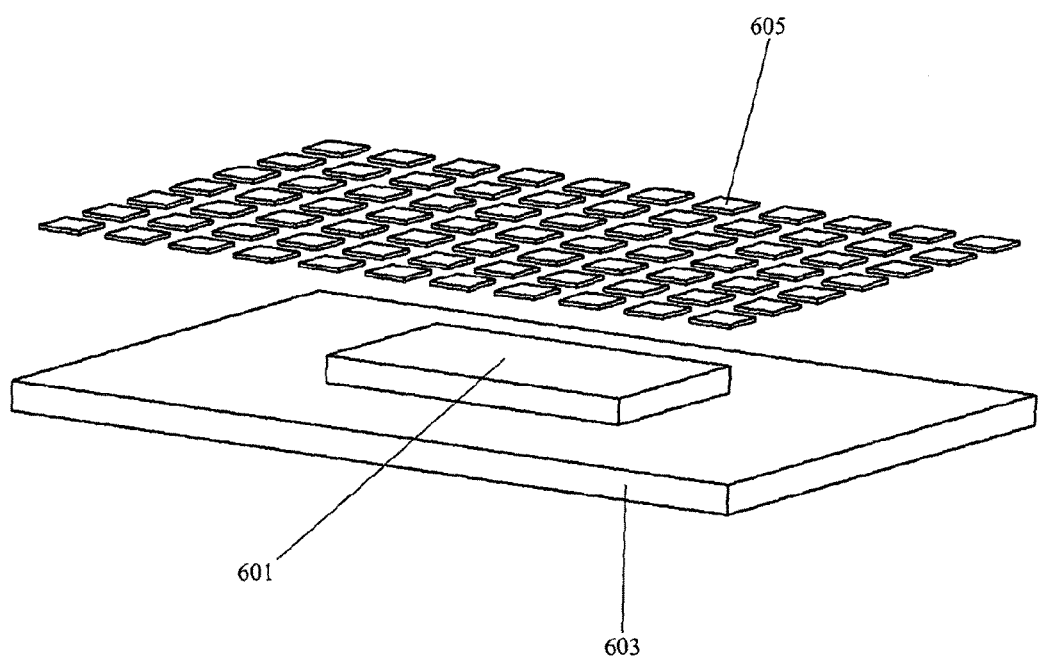
FIG. 6 is an example planar cavity including an LED die is placed on a substrate, surrounded by PRS elements in a planar arrangement.

An embodiment comprising a planar configuration is shown in FIG. 6. A light source 601 (for example, an LED die) is placed on top of a planar substrate 603, which may or may not be reflective. A support material in rectangular shape is placed on top of the substrate and the die. The reflective elements 605 are then placed on top of the support material. Optionally, fluorescent material (such as phosphors) may be included either inside or outside the cavity. The reflective surfaces of the substrate and/or the reflective component may be created using either metals or low-loss reflectors like Bragg mirrors, for example.

Figure 7A:
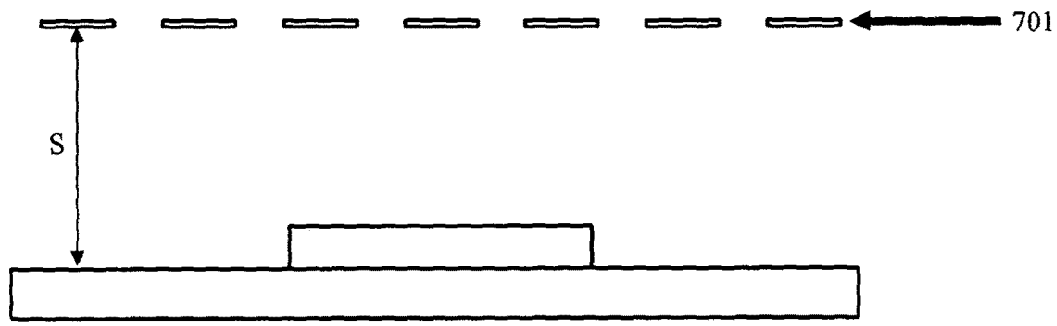
FIG. 7A is a side view of an example planar cavity showing the separation distance, S, between the reflector/substrate, and the array of reflective elements.
Figure 7B:
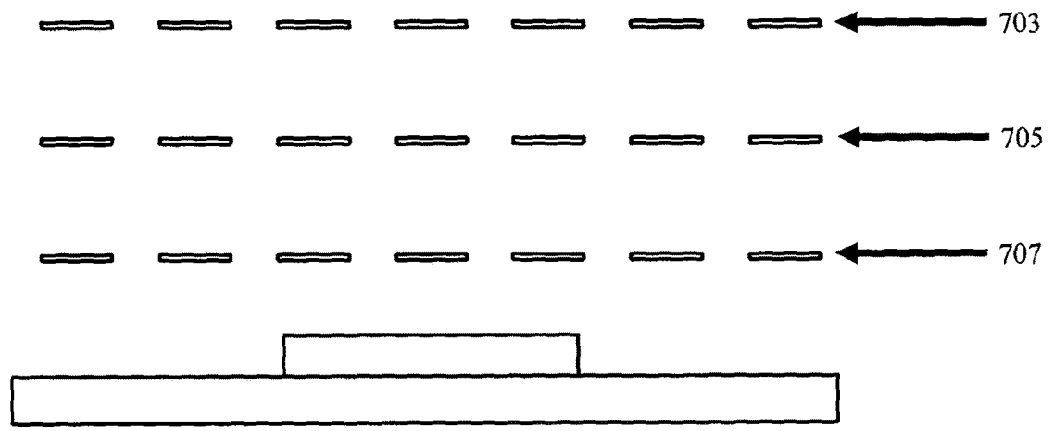
FIG. 7B is a side view of an example planar cavity comprising multiple layers of metamaterial.
Figure 8A:
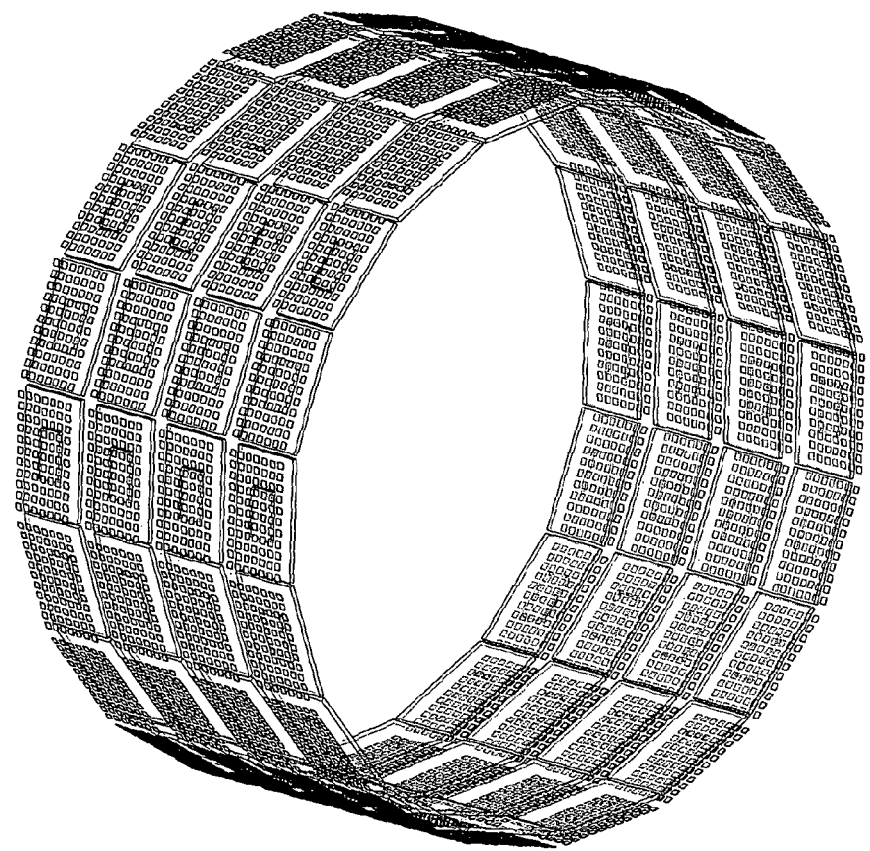
FIG. 8A is an example cylindrical array of planar metamaterial cells.
Figure 8B:
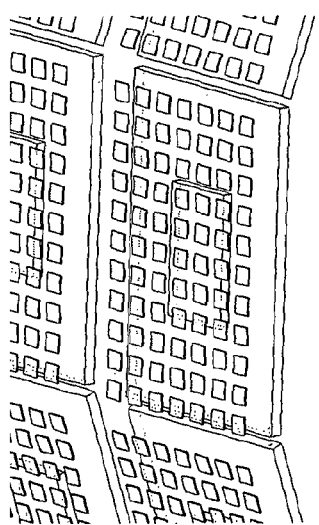
FIG. 8B shows further detail of FIG. 8A.
Figure 9:
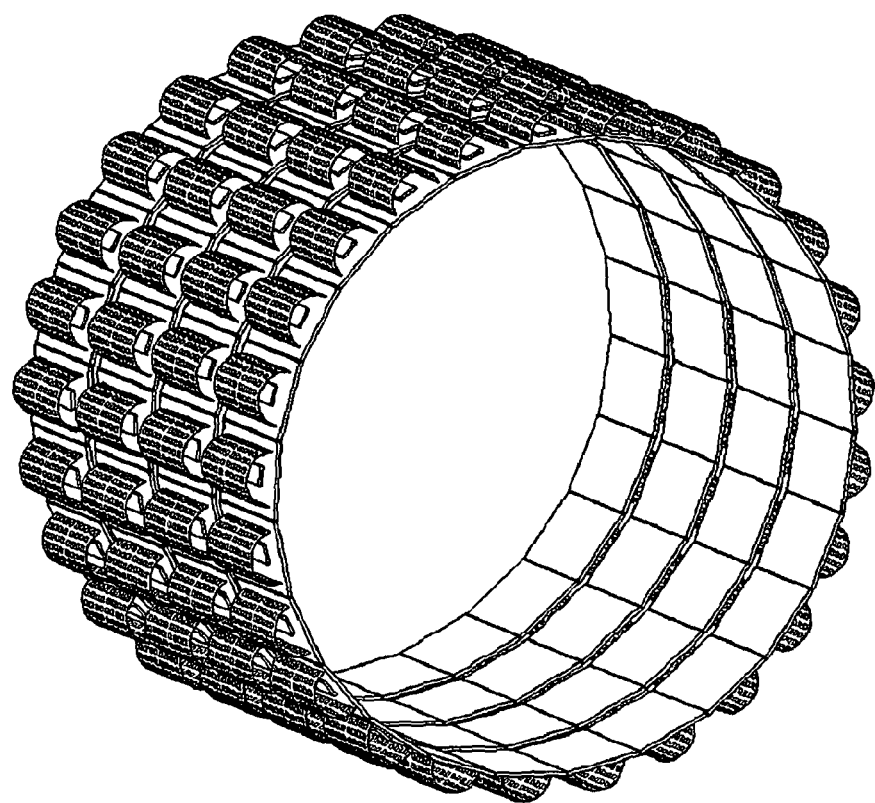
FIG. 9 shows an example cylindrical array of cylindrical cavities.
Figure 10:
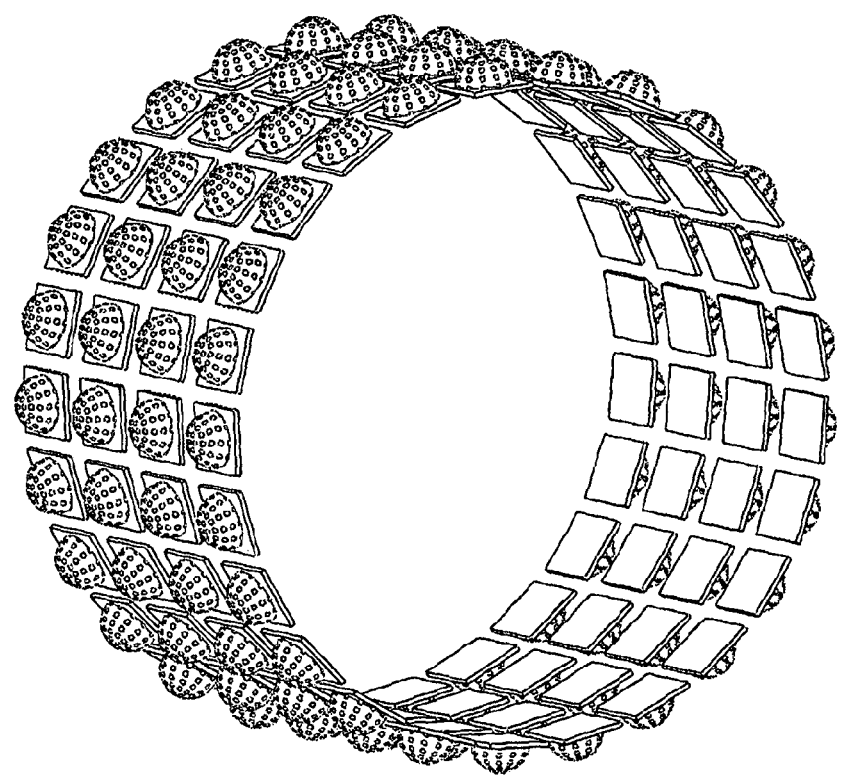
FIG. 10 is an example cylindrical array of spherical cavities.
Figure 11A:
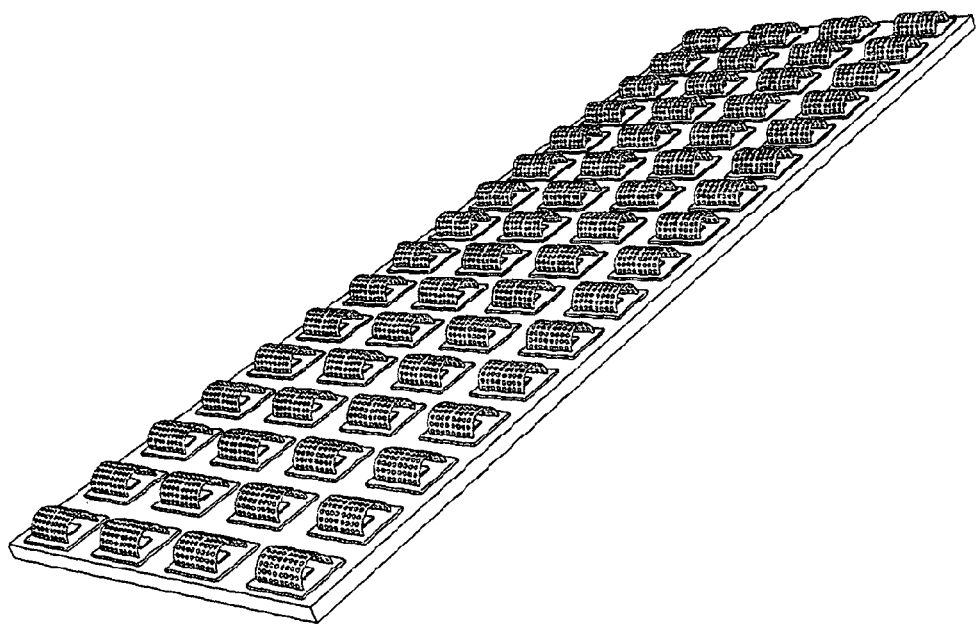
FIG. 11A shows an example planar array of cylindrical cells.
Figure 11B:
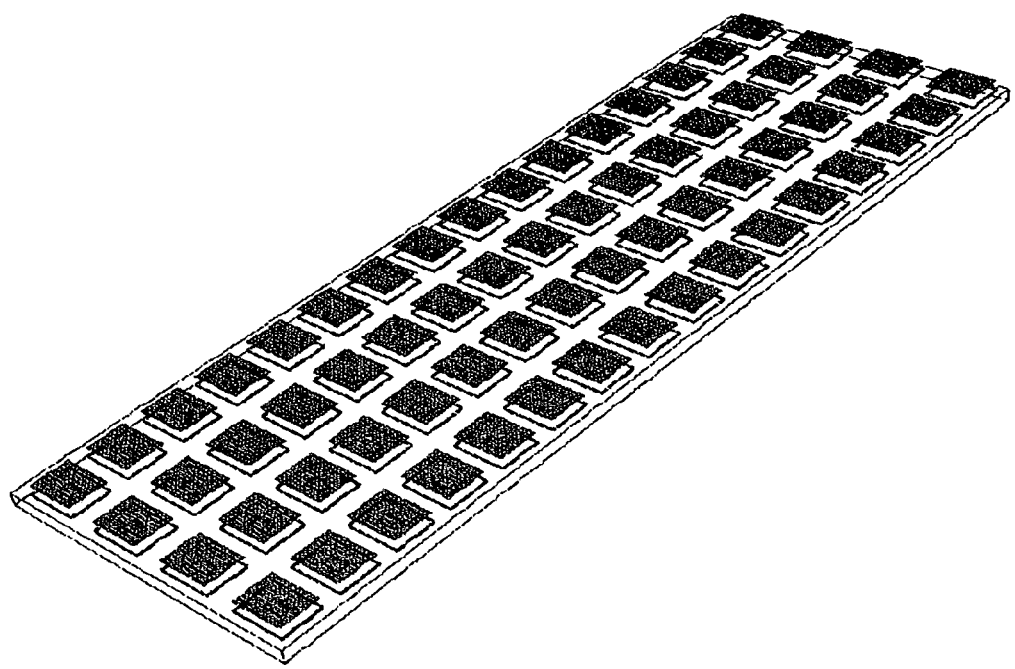
FIG. 11B shows an example planar array of planar cells.
Figure 12A:
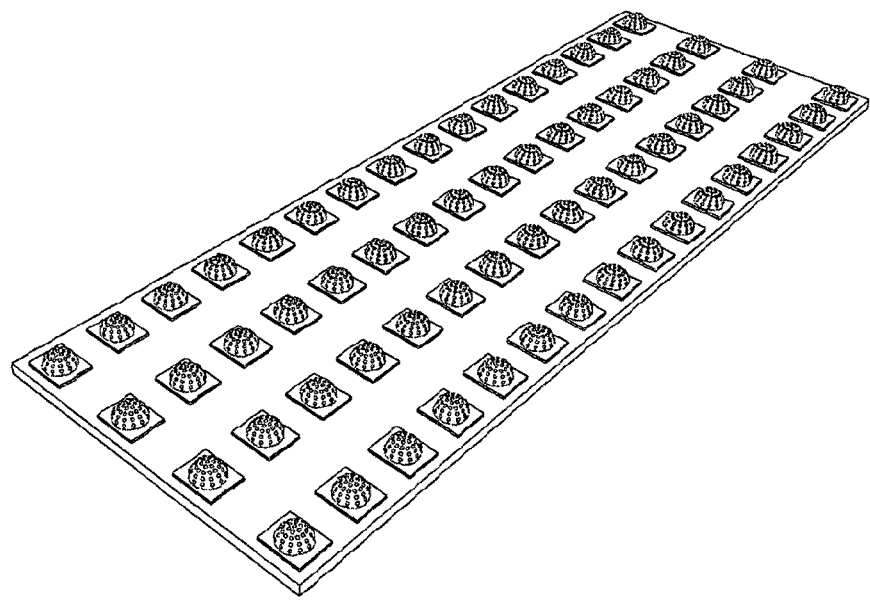
FIG. 12A shows an example planar array of spherical cavities.
Figure 12B:
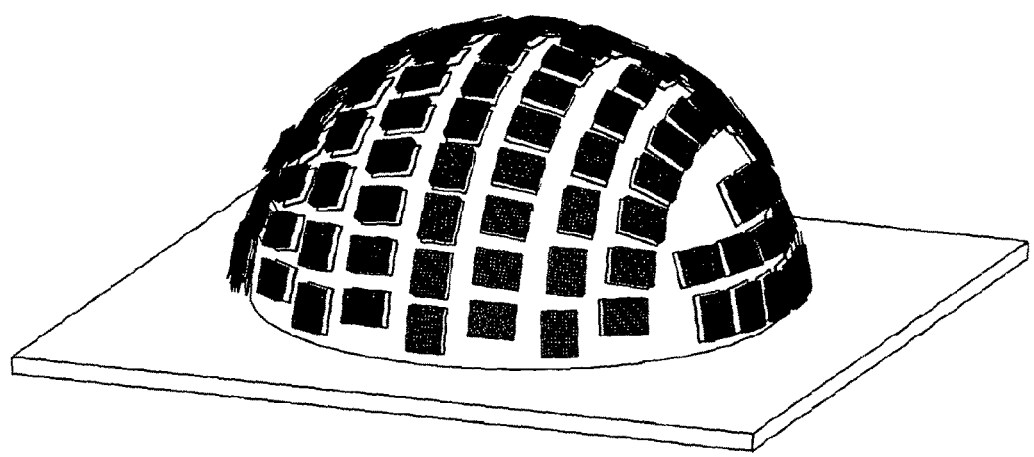
FIG. 12B shows an example spherical array of planar cavities.

As discussed above, in embodiments, further metamaterials may be added as additional layers for example to provide a multiband response such as broadband response. FIG. 7A shows a schematic of an example planar cavity comprising one optical metamaterial (701). FIG. 7B shows a schematic of an example planar cavity having three optical metamaterials (703, 705, 707). The skilled person will understand that any number of optical metamaterials may be used.

The inventors have found that there is a trade-off in that the higher the reflectivity of the metamaterial, the stronger the fields inside the cavity but the lower the bandwidth of the emitted radiation. Notably, the inventors have found that an advantageous balance between bandwidth and cavity performance can be achieved by using a metamaterial with a reflectivity of 66-75%. In embodiments, it is found that this provides a 3× to 5× energy gain increase.

The inventors have further addressed the trade-off between gain and bandwidth by providing a multiple cavity design.

Multiple Cavities

In an embodiment, there is provided a device having multiple sources and planar cavities. The multiple cavities may be placed on top of a cylindrical substrate, for example. Each cavity may have different geometry, i.e. reflective elements of different shape and/or size. This allows each cavity to emit light at a different part of the electromagnetic spectrum, so that the overall output is broadband, such as white light, for example. Each cavity may not give rise to the first (m=1) resonance, but may utilize higher order resonances.

Multi-cavity embodiments are shown in FIGS. 8 to 12.

In multi-cavity embodiments, each cavity may utilize periodic elements of different shape and size, in order to enhance the overall bandwidth of the system. There may therefore be provided multiple cavities, each of which is tuned to operate optimally around a given wavelength of light. The combined light output of all cavities may, for example, generate white illumination over the whole visible spectrum.

Embodiments relate to incandescent lamps and LEDs but the present disclosure is equally applicable to any light source including any unidirectional or omni-directional light source.

Advantageously, the system in accordance with embodiments may be used as an "add-on" component for existing electromagnetic sources (e.g. incandescent filaments & solid state light sources). The device is passive, i.e. it does not require an external power source or an active control system.

The device in accordance with embodiments increases the luminous power over a certain wavelength range in the optical spectrum. It can be tuned to increase the brightness of a narrowband light source (e.g. a laser or LED) or be tuned to increase the brightness of a broadband light source over the entire band. Embodiments relate to increasing the luminous efficacy, i.e. how well the device produces light from input watts. This may be achieved with the arrangement of a single cavity geometry (i.e. a planar, cylindrical or spherical single cavity) which can achieve high efficacy, more lumens per watt at a given direction compared to a source without the cavity. When a number of these cavities are clustered together in a planar, cylindrical, or spherical setup for example, multiple light beams can be achieved each of high efficacy each. This, in turn, increases the total luminous flux.

Any reference to visible light in the present disclosure is by way of example only and the present disclosure is equally applicable to infra-red and ultra-violet light.

Although aspects and embodiments have been described above, variations can be made without departing from the inventive concepts disclosed herein.

The invention claimed is:

1. A device arranged to couple with an electromagnetic source, the device comprising an optical metamaterial arranged to increase the intensity of radiation at a predetermined optical wavelength, the optical metamaterial having a periodic reflective component having a dimension no greater than the predetermined wavelength; wherein the optical metamaterial further comprises a fluorescent material to convert radiation at the predetermined optical wavelength to a further optical wavelength.

2. A device as claimed in claim 1 wherein the periodic reflective component comprises a regular array of reflective elements, wherein each reflective element has a first dimension no greater than the predetermined optical wavelength.

3. A device as claimed in claim 1 wherein the periodic reflective component comprises a regular grid having a periodicity in one dimension no greater than the predetermined optical wavelength.

4. A device as claimed in claim 1 wherein the periodic reflective component is supported by a dielectric.

5. A device as claimed in claim 1 further comprising a reflector.

6. A device as claimed in claim 5 wherein the reflector is a second optical metamaterial having a periodic reflective component.

7. A device as claimed in claim 5 wherein the optical metamaterial and reflector are respectively arranged to form an open or closed cavity arranged to receive an electromagnetic source.

8. A device as claimed in claim 5 wherein the cavity is arranged to emit radiation at the predetermined optical wavelength at a predetermined angle, θ, to the optical metamaterial.

9. A device as claimed in claim 8 wherein the optical metamaterial and reflector are spatially separated by a distance, S, defined by the equation:

$$S = \left(\frac{\varphi(\theta)}{\pi} - 1\right)\frac{\lambda_0}{4} + m\frac{\lambda_0}{2},$$

where $\varphi(\theta)$ is the reflection coefficient phase at the predetermined angle, $\lambda_0$ is the predetermined wavelength and m is an integer.

10. A device as claimed in claim 1 further comprising a further optical metamaterial layered with the first optical metamaterial, the further optical metamaterial having a periodic reflective component arranged to increase the intensity of radiation, from the electromagnetic source, at a second predetermined optical wavelength.

11. A radiation emitting device comprising:
a cavity at least partially delimited by an optical metamaterial and a reflector;
an electromagnetic source within the cavity; and wherein the optical metamaterial comprises a periodic reflective component arranged to receive radiation from the electromagnetic source and increase the intensity of radiation at a predetermined optical wavelength;
wherein the optical metamaterial further comprises a fluorescent material to convert radiation at the predetermined optical wavelength to a further optical wavelength.

12. A radiation emitting device as claimed in claim 11 wherein the periodic reflective component comprises: a regular array of reflective elements, wherein each reflective element has a first dimension no greater than the predetermined optical wavelength; or a regular grid having a periodicity in one dimension no greater than the predetermined optical wavelength.

13. A radiation emitting device as claimed in claim 11 wherein the cavity is planar, at least partially spherical, hemispherical or at least partially cylindrical.

14. A radiation emitting device as claimed in claim 11 wherein the device is arranged to emit light at the predetermined optical wavelength at a predetermined angle to the optical metamaterial.

15. An array of radiation emitting devices as claimed in claim 11 wherein the light emitting devices are arranged in a planar array or cylindrical array.

16. A device as claimed in claim 1 wherein the electromagnetic source is at least one selected from the group comprising: an incandescent lamp; a light-emitting diode; a compact fluorescent lamp; and a laser.

17. A device as claimed in claim 11 wherein the electromagnetic source is at least one selected from the group comprising: an incandescent lamp; a light-emitting diode; a compact fluorescent lamp; and a laser.

18. A device as claimed in claim 1 wherein the fluorescent material comprises phosphor.

19. A device as claimed in claim 1 wherein the fluorescent material converts radiation at the predetermined optical wavelength to a visible wavelength.

20. A device arranged to couple with an electromagnetic source, the device comprising an optical metamaterial arranged to increase the intensity of radiation at a predetermined optical wavelength, the optical metamaterial having a periodic reflective component having a dimension no greater than the predetermined wavelength, and a reflector, wherein the reflector is a second optical metamaterial having a periodic reflective component.

21. A device as claimed in claim 20 wherein the periodic reflective component comprises a regular array of reflective elements, wherein each reflective element has a first dimension no greater than the predetermined optical wavelength.

22. A device as claimed in claim 20 wherein the periodic reflective component comprises a regular grid having a periodicity in one dimension no greater than the predetermined optical wavelength.

23. A device as claimed in claim 20 wherein the periodic reflective component is supported by a dielectric.

24. A device as claimed in claim 20 wherein the optical metamaterial and reflector are respectively arranged to form an open or closed cavity arranged to receive an electromagnetic source.

25. A device as claimed in claim 20 wherein the cavity is arranged to emit radiation at the predetermined optical wavelength at a predetermined angle, θ, to the optical metamaterial.

26. A device as claimed in claim 25 wherein the optical metamaterial and reflector are spatially separated by a distance, S, defined by the equation:

$$S = \left(\frac{\varphi(\theta)}{\pi} - 1\right)\frac{\lambda_0}{4} + m\frac{\lambda_0}{2},$$

where $\varphi(\theta)$ is the reflection coefficient phase at the predetermined angle, $\lambda_0$ is the predetermined wavelength and m is an integer.

27. A device as claimed in claim 20 further comprising a further optical metamaterial layered with the first optical metamaterial, the further optical metamaterial having a periodic reflective component arranged to increase the intensity of radiation, from the electromagnetic source, at a second predetermined optical wavelength.

28. A device as claimed in claim 20 wherein the electromagnetic source is at least one selected from the group comprising: an incandescent lamp; a light-emitting diode; a compact fluorescent lamp; and a laser.

29. A device arranged to couple with an electromagnetic source, the device comprising an optical metamaterial arranged to increase the intensity of radiation at a predetermined optical wavelength, the optical metamaterial having a periodic reflective component having a dimension no greater than the predetermined wavelength, and a reflector;
wherein the optical metamaterial and reflector are respectively arranged to form an open or closed cavity arranged to receive an electromagnetic source, the cavity is arranged to emit radiation at the predetermined optical wavelength at a predetermined angle, θ, to the optical metamaterial;
wherein the optical metamaterial and reflector are spatially separated by a distance, S, defined by the equation:

$$S = \left(\frac{\varphi(\theta)}{\pi} - 1\right)\frac{\lambda_0}{4} + m\frac{\lambda_0}{2},$$

where $\varphi(\theta)$ is the reflection coefficient phase at the predetermined angle, $\lambda_0$ is the predetermined wavelength and m is an integer.

30. A device as claimed in claim 29 wherein the periodic reflective component comprises a regular array of reflective elements, wherein each reflective element has a first dimension no greater than the predetermined optical wavelength.

31. A device as claimed in claim 29 wherein the periodic reflective component comprises a regular grid having a periodicity in one dimension no greater than the predetermined optical wavelength.

32. A device as claimed in claim 29 wherein the periodic reflective component is supported by a dielectric.

33. A device as claimed in claim 29 further comprising a further optical metamaterial layered with the first optical metamaterial, the further optical metamaterial having a periodic reflective component arranged to increase the intensity of radiation, from the electromagnetic source, at a second predetermined optical wavelength.

34. A device as claimed in claim 29 wherein the electromagnetic source is at least one selected from the group comprising: an incandescent lamp; a light-emitting diode; a compact fluorescent lamp; and a laser.

35. A device arranged to couple with an electromagnetic source, the device comprising an optical metamaterial arranged to increase the intensity of radiation at a predetermined optical wavelength, the optical metamaterial having a periodic reflective component having a dimension no greater than the predetermined wavelength; further comprising a further optical metamaterial layered with the first optical metamaterial, the further optical metamaterial having a periodic reflective component arranged to increase the intensity of radiation, from the electromagnetic source, at a second predetermined optical wavelength.

36. A device as claimed in claim 35 wherein the periodic reflective component comprises a regular array of reflective elements, wherein each reflective element has a first dimension no greater than the predetermined optical wavelength.

37. A device as claimed in claim 35 wherein the periodic reflective component comprises a regular grid having a periodicity in one dimension no greater than the predetermined optical wavelength.

38. A device as claimed in claim 35 wherein the periodic reflective component is supported by a dielectric.

39. A device as claimed in claim 35 further comprising a reflector.

40. A device as claimed in claim 39 wherein the optical metamaterial and reflector are respectively arranged to form an open or closed cavity arranged to receive an electromagnetic source.

41. A device as claimed in claim 35 wherein the electromagnetic source is at least one selected from the group comprising: an incandescent lamp; a light-emitting diode; a compact fluorescent lamp; and a laser.

* * * * *